US006953291B2

United States Patent
Liu

(10) Patent No.: US 6,953,291 B2
(45) Date of Patent: Oct. 11, 2005

(54) COMPACT PACKAGE DESIGN FOR VERTICAL CAVITY SURFACE EMITTING LASER ARRAY TO OPTICAL FIBER CABLE CONNECTION

(75) Inventor: Yue Liu, Plymouth, MN (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/607,982

(22) Filed: Jun. 30, 2003

(65) Prior Publication Data

US 2004/0264884 A1 Dec. 30, 2004

(51) Int. Cl.[7] .............................. G02B 6/36; G02B 6/42; H01L 21/00
(52) U.S. Cl. ............................... 385/94; 385/88; 385/89; 385/90; 385/91; 385/92; 385/93; 257/431; 257/432; 257/433; 257/434; 257/678; 257/680; 257/690; 257/693; 257/703; 257/704; 257/705; 257/706; 438/106; 438/107; 438/116; 438/121; 438/122; 438/123; 438/124; 438/125; 438/128; 438/129
(58) Field of Search ............................ 385/88–94, 147; 372/29.013, 29.022, 36, 50, 98, 99, 109; 257/678, 680, 703–706, 729–731, 690, 693, 431–434, 778–780; 438/106–116, 121–129

(56) References Cited

U.S. PATENT DOCUMENTS

| 5,200,367 | A | * | 4/1993 | Ko | 29/827 |
|---|---|---|---|---|---|
| 5,586,207 | A | * | 12/1996 | Goodwin | 385/92 |
| 5,897,338 | A | * | 4/1999 | Kaldenberg | 438/116 |
| 5,903,588 | A | | 5/1999 | Guenter et al. | |
| 6,064,488 | A | * | 5/2000 | Brand et al. | 356/440 |
| 6,531,341 | B1 | * | 3/2003 | Peterson et al. | 438/123 |
| 6,594,050 | B2 | * | 7/2003 | Jannson et al. | 398/52 |
| 6,597,713 | B2 | * | 7/2003 | Ouchi | 372/36 |
| 6,606,427 | B1 | * | 8/2003 | Graves et al. | 385/17 |
| 6,636,540 | B2 | * | 10/2003 | Uebbing | 372/36 |
| 6,661,084 | B1 | * | 12/2003 | Peterson et al. | 257/680 |
| 6,674,159 | B1 | * | 1/2004 | Peterson et al. | 257/680 |
| 2002/0176468 | A1 | * | 11/2002 | Kaneko | 372/50 |
| 2003/0015776 | A1 | * | 1/2003 | Recklenwald et al. | 257/678 |
| 2003/0026303 | A1 | * | 2/2003 | Ouchi | 372/36 |
| 2003/0081645 | A1 | * | 5/2003 | Uebbing | 372/101 |
| 2003/0127661 | A1 | * | 7/2003 | Takagi | 257/98 |
| 2003/0137022 | A1 | * | 7/2003 | Dautartas et al. | 257/432 |
| 2004/0264884 | A1 | * | 12/2004 | Liu | 385/89 |

OTHER PUBLICATIONS

U.S. Appl. No. 10/680,201, filed Oct. 8, 2003, Harold Y. Walker, Jr. et al.

* cited by examiner

Primary Examiner—John R. Lee
Assistant Examiner—Bernard E. Souw
(74) Attorney, Agent, or Firm—Workman Nydegger

(57) ABSTRACT

A hermetically sealed, opto-electronic array housing assembly having a ceramic base, electrical connectors, a metal can, and a glass window. The glass window can support a micro-lens array. The metal can receives the glass window. The electrical impedance of the electrical connectors is beneficially carefully controlled to enable high-speed data communications. A multi-element optical fiber connector can provide for optical communications to and/or from an opto-electronic array contained within the housing.

22 Claims, 8 Drawing Sheets

COMPACT PACKAGE DESIGN FOR VERTICAL CAVITY SURFACE EMITTING LASER ARRAY TO OPTICAL FIBER CABLE CONNECTION

CROSS-REFERENCE TO RELATED APPLICATIONS

BACKGROUND OF THE INVENTION

1. Field of the Invention

This invention relates to the packaging of opto-electronic devices and arrays, specifically including vertical cavity surface emitting laser arrays and photo detector arrays, that couple to optical fibers.

2. Discussion of the Related Art

Vertical cavity surface emitting lasers (VCSELs) represent a relatively new class of semiconductor lasers. While there are many variations of VCSELs, one common characteristic is that they emit light perpendicular to a wafer's surface. Advantageously, VCSELs can be formed from a wide range of material systems to produce specific device characteristics. In particular, the various material systems can be tailored to emit different wavelengths, such as 1550 nm, 1310 nm, 850 nm, 670 nm, and so on.

VCSELs include semiconductor active regions, distributed Bragg reflector (DBR) mirrors, current confinement structures, substrates, and contacts. Because of their complicated structure, and because of their material requirements, VCSELs are usually grown using metal-organic chemical vapor deposition (MOCVD) or molecular beam epitaxy (MBE).

FIG. 1 illustrates a typical VCSEL 10. As shown, an n-doped gallium arsenide (GaAs) substrate 12 has an n-type electrical contact 14. An n-doped lower mirror stack 16 (a DBR) is on the substrate 12, and an n-type graded-index lower spacer 18 is disposed over the lower mirror stack 16. An active region 20, usually having a number of quantum wells, is formed over the lower spacer 18. A p-type graded-index top spacer 22 (another confinement layer) is disposed over the active region 20, and a p-type top mirror stack 24 (another DBR) is disposed over the top spacer 22. Over the top mirror stack 24 is a p-type conduction layer 9, a p-type GaAs cap layer 8, and a p-type electrical contact 26.

Still referring to FIG. 1, the lower spacer 18 and the top spacer 22 separate the lower mirror stack 16 from the top mirror stack 24 such that an optical cavity is formed. As the optical cavity is resonate at specific wavelengths, the mirror separation is controlled so as to resonant at a predetermined wavelength (or at a multiple thereof). At least part of the top mirror stack 24 includes an insulating region 40, formed by implanting ions (protons), that provides current confinement. Alternatively, the insulating region 40 can be formed using an oxide layer, for example, in accordance with the teachings of U.S. Pat. No. 5,903,588, which is incorporated by reference. In either case, the insulating region 40 defines a conductive annular central opening 42 that forms an electrically conductive path through the insulating region 40.

In operation, an external bias causes an electrical current 21 to flow from the p-type electrical contact 26 toward the n-type electrical contact 14. The insulating region 40 and the conductive central opening 42 confine the current 21 such that it flows through the conductive central opening 42 to the active region 20. Some of the electrons in the current 21 are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the p-type conduction layer 9, through the p-type GaAs cap layer 8, through an aperture 30 in the p-type electrical contact 26, and out of the surface of the vertical cavity surface emitting laser 10.

It should be understood that FIG. 1 illustrates a common VCSEL structure, and that numerous variations are possible. For example, the doping can be changed (say, by providing a p-type substrate 12), different material systems can be used, operational details can be tuned for maximum performance, and additional structures, such as tunnel junctions, can be added.

While individual VCSELs are of great interest, some applications can benefit from arrays of VCSEL elements, while other applications can benefit from arrays of photo detectors. For example, FIG. 2 illustrates a VCSEL array 72 comprised of four, evenly spaced, individual VCSEL elements 73, each of which could be a VCSEL 10 as shown in FIG. 1, and a photo detector array 74 comprised of photo detector elements 75. The individual array elements are usually spaced apart the same distance, for example, 250 microns. Bonding wires 80 connect the array elements to conductors 76 on a substrate that terminate in pads 78.

While generally successful in serial module applications based on a discrete VCSEL and Photo-Detector (PD), applications with VCSEL arrays and photo detector arrays have many more challenges. One particular problem is interconnecting VCSEL arrays and/or photo detector arrays with higher-level systems. Such interconnections often require electrical attachment to another structure (such as a printed circuit board) that provides electrical signals and optical coupling to optical fibers. To assist electrical attachment, VCSEL/photo detector array substrates are usually relatively large, which adds significantly to their cost. Furthermore, the tab bonding that is conventionally used for electrical attachment does not meet the design challenges of high-speed data and telecommunication applications. Such design challenges include well-controlled impedances and low parasitic capacitances.

Many of today's high volume commercial applications of VCSELs involve high data rate (multiple gigabytes per second), serial fiber optic transceiver applications. To provide the required reliability, such applications require hermetically sealed packages. To take advantage of existing investments in device packaging and assembly tooling, it is beneficial to use package configurations that are similar to TO-type hermetic packages for parallel transmitter and receiver components. However, most emerging parallel fiber transceiver implementations for VCSELs use non-standard, non-hermetically sealed packages. This creates problems for system designers, particularly when high reliability in high temperature, high humidity environments is required. Optically coupling arrays to paralleled ribbon optical fiber connectors can be very difficult to do in a package that provides good electrical signal integrity, high optical coupling efficiency, and hermiticity.

Furthermore, optically coupling VCSEL and/or detector array substrates to optical fibers requires precise physical alignment. Such alignment is difficult to achieve, particularly when parallel optical fiber connectors are used.

Therefore, a new technique of packaging semiconductor arrays would be beneficial. Even more beneficial would be a new technique of packaging semiconductor arrays in a hermetically sealed package. Still more beneficial would be a new technique of packaging and hermetically sealing a semiconductor array such that the individual elements of the semiconductor array can be optically coupled to optical fibers. Even more beneficial would be an electrically connectable package that facilitates electrical connections between a hermetically packaged opto-electronic array and external circuitry, while providing for interfacing of individual optical elements with optical fibers.

SUMMARY OF THE INVENTION

Accordingly, one aspect of the present invention is directed to a novel, compact housing package that provides for opto-electronic array (such as VCSEL arrays and photo detector arrays)-to-optical fiber cable connections.

Another aspect of the present invention is directed to a novel compact housing package that incorporates micro lens arrays made from optical epoxy. Such micro lens arrays can be produced at a low cost by using techniques such as ink jet ejection.

An advantage of the present invention is a technique of interconnecting a VCSEL array with parallel optical fiber ribbon.

Another advantage of the present invention is a submount that supports a VCSEL array and that employs a vertical-walled housing.

Another advantage of the present invention is a submount that supports, for example, a VCSEL array and includes an insulating glass slide cover.

Another advantage of the present invention is a VCSEL array employing a micro inkjet lens array and a multi-layer ceramic housing.

A opto-electronic housing package according to the principles of the present invention includes a submount having a plurality of conductive traces on a surface, and a plurality of opto-electronic elements attached to the submount. Furthermore, the submount has a plurality of walls extending up from the submount to support a glass slide. Additionally, a plurality of bonding wires electrically connects the individual opto-electronic elements to a plurality of conductive traces on the upper portion.

An alternative opto-electronic housing package according to the principles of the present invention includes a submount having a plurality of conductive traces on a lower portion, an upper portion over the lower portion, and a plurality of conductive vias that pass through the submount's body. A plurality of opto-electronic elements are attached to the submount with the individual opto-electronic elements electrically connected thorough the lower portion to the conductive vias. Furthermore, bonding wires electrically connect the individual opto-electronic elements to the conductive traces.

In either of the above embodiments, an opto-electronic housing package according to the principles of the present invention employs a plurality of opto-electronic elements, for example, a 1×4 or 1×12 VCSEL array that operates in conjunction with a micro lens array that is supported over the VCSEL array.

The micro lens array may be supported by the glass slide that in turn rests on at least two of the vertical walls extending up from the submount. The micro lens array may be made from optical-grade epoxy whereby the epoxy is ejected onto the glass slide by an inkjet ejection method. The optical-grade epoxy that forms the micro lens array may also be used secure the glass slide to the at least two vertical wall sections.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

Figure 1:
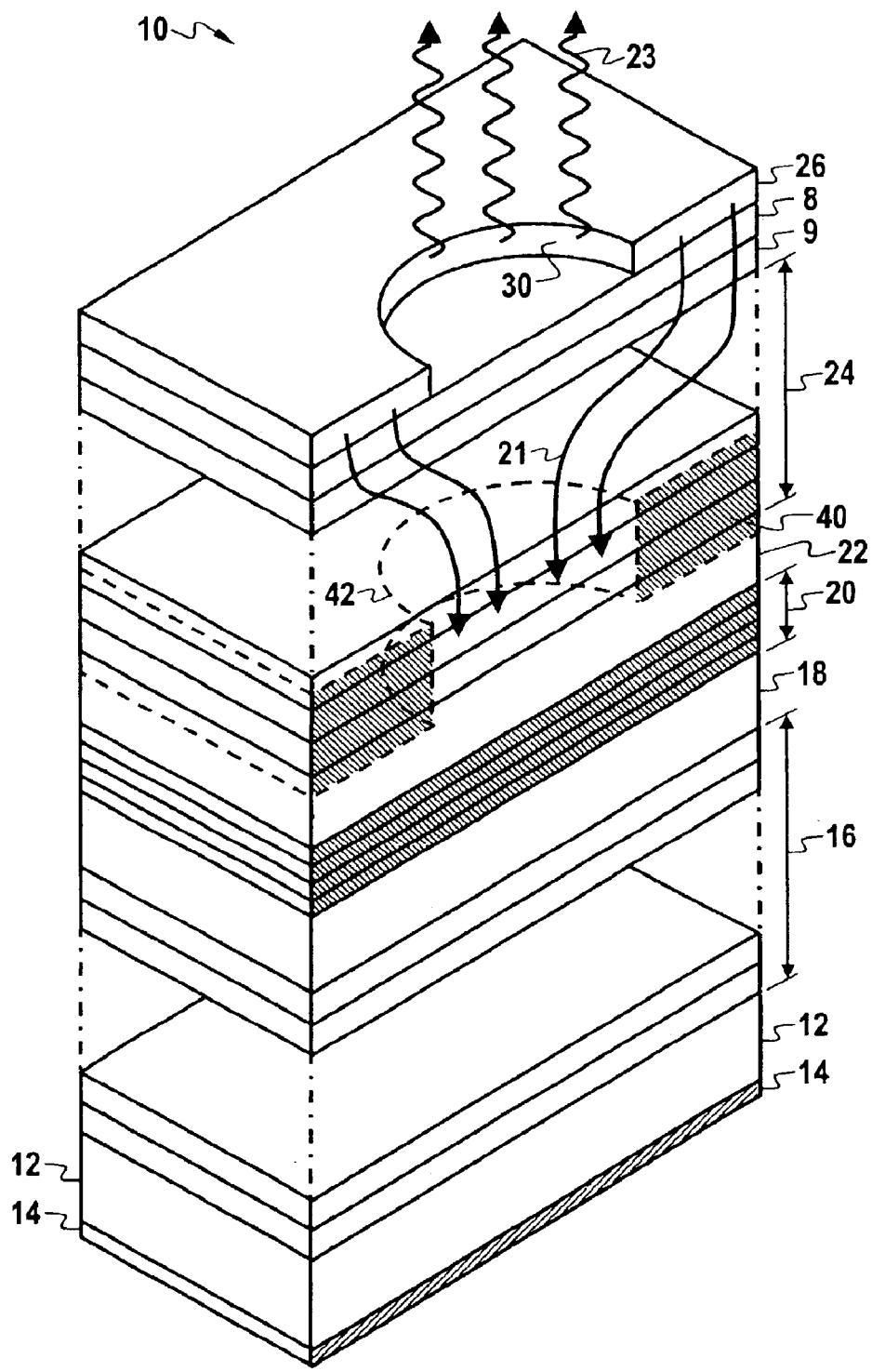
FIG. 1 illustrates a typical vertical cavity surface emitting laser.

Note that in the drawings that like numbers designate like elements. Additionally, for explanatory convienence this document uses directional signals such as up and down, top and bottom, and lower and upper. Those signals are derived from the relative positions of the elements as illustrated in the drawings. Such signals are meant to aid understanding the present invention, not to limit it.

DETAILED DESCRIPTION OF THE ILLUSTRATED EMBODIMENTS

Reference will now be made in detail to embodiments of the present invention, examples of which are illustrated in the accompanying drawings.

The principles of the present invention provide for robust opto-electronic device packages that (a) can be hermetically sealed; (b) can be implemented in a TO-like package; (c) can incorporate glass windows on a metal can, (d) can enable robust electrical input-output schemes for operation at 10 G+ data rates, (e) can optically interface with ribbon-type optical fiber connectors, (f) can optically couple to the external environment via mirrors and lenses, (g) can incorporate low-cost, high performance micro-optics, and that (h) can leverage existing die mounting, can-welding, alignment and assembling practices and techniques.

Figure 2:
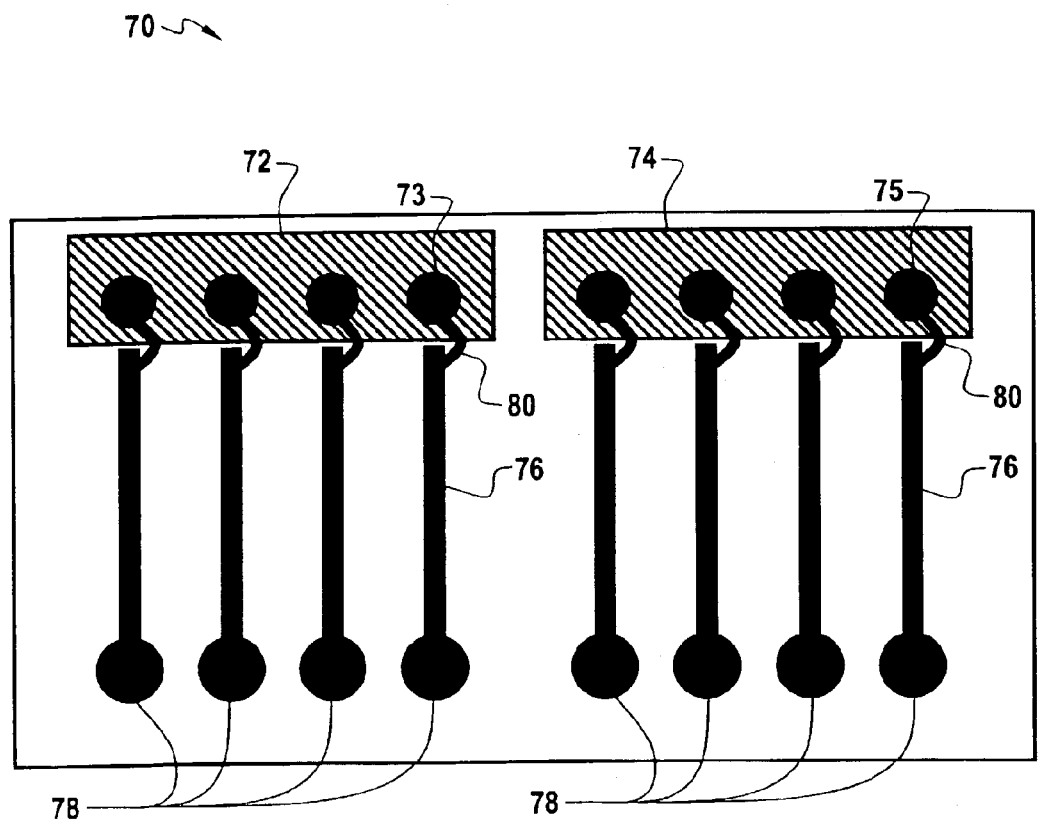
FIG. 2 illustrates a top down view of a substrate having a VCSEL array and a photo detector array.
Figure 3:
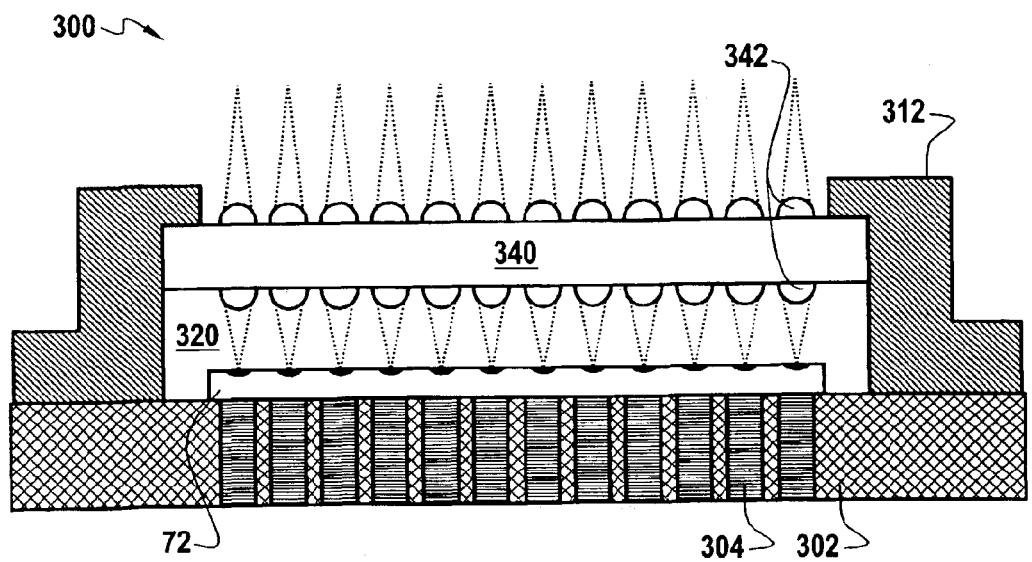
FIG. 3 illustrates a front cut-away view of a first embodiment opto-electronic packaging assembly that is in accord with the principles of the present invention.
Figure 4:
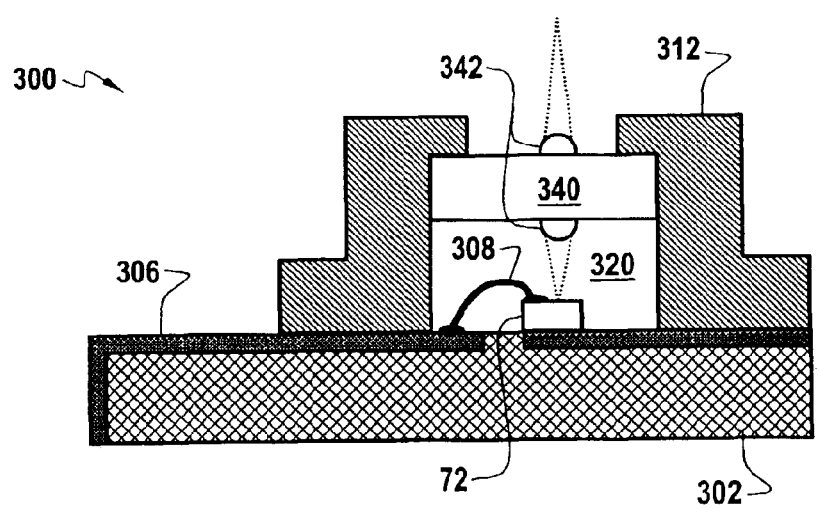
FIG. 4 illustrates a side cut-away view of the first embodiment opto-electronic packaging assembly.

FIGS. 3 and 4 illustrate a first embodiment opto-electronic device package 300 that is in accord with the principles of the present invention. The first embodiment can include, or be used in, one or more variations or applications that are subsequently described. The opto-electronic device package 300 is shown packaging a VCSEL array 72. However, it should be understood that the opto-electronic device package 300, as well as the other opto-electronic device packages that are described subsequently, could be used to package other types of opto-electronic devices, specifically including photo-detector arrays. As shown in FIG. 2, the VCSEL array 72 includes conductive patterns and structures that are used to electrically interconnect the array elements.

The VCSEL array 72 is attached to a ceramic chip carrier 302 having metal ground thermal plugs 304. The VCSEL array die 72 is attached via a thermally conductive epoxy, solder, or similar bonding agent. The ceramic chip carrier 302 is beneficial because of its structural stability, reasonable cost, and wide availability. An alternative chip carrier material is silicon.

Referring now specifically to FIG. 4, the ceramic chip carrier 302 includes a plurality of conductive patterns 306 that beneficially terminate near the VCSEL array 72 in conductive pads (not specifically shown). Depending on how electrical connections are made to the opto-electronic array-device package 300 and on how that device package is mounted (see below), the conductive patterns 306 can extend along the top, along the sides, and possibly along the bottom of the ceramic chip carrier 302. It is desirable to have the conductive patterns 306 plated with gold over nickel to assist electrical interconnection with other electronic devices. Furthermore, bonding leads 308 electrically connect the conductive patterns 306 to associated elements of the VCSEL array 72.

Referring once again to FIGS. 3 and 4, a metal can 312 is welded onto the ceramic chip carrier 302 to form a hermetic seal. The metal can 312 is located such that the conductive patterns 306 extend across the metal can 312, thus enabling electrical connections to the VCSEL array 72. An insulator (not shown) electrically isolates the metal can 312 from the conductive patterns 306. The metal can 312 forms an internal well 320 that houses and protects the VCSEL array die 72 and the bonding wires 308.

As shown, the metal can 312 retains a glass window 340 that supports a micro lens array 342. While FIGS. 3 and 4 show a micro lens array 342 comprised of micro-lenses both on top of and below the glass window 340, in practice, and as subsequently shown in variations of the opto-electronic array device package 300, this is not required. Indeed, micro lens 342 may be needed only on the top of the window, below the window, or need not exist at all. It is, however, beneficial for applications with VCSEL arrays to have the micro lens array 342 at least below the glass window 340, since doing so can prevent the optical beams from the VCSEL array elements, each of which is positioned at a relatively small pitch such as 250 $\mu$m in the array, from interfering each other.

However, if used the micro lens array 342 is beneficially comprised of individual micro lens made of a nonconductive, optical grade epoxy. The micro lens array 342 is beneficially created by ejecting an optical grade epoxy onto the glass window 340 via a micro inkjet nozzle (not shown), and then curing that epoxy under ultra violet light. This production method provides a fast, easy, low cost method of large scale manufacturing of lens arrays. Furthermore, the production parameters for a micro lens array 342 may be changed without changing the production line equipment since a simple, computerized program may be used to produce an array of micro lens 342. A desirable micro lens 342 having particular optical characteristics may be created by micro inkjet ejection of a predetermined amount of a particular optical epoxy or similar optical material. Additionally, micro inkjet ejection fabrication can precisely produce the desired pattern, with the individual micro lenses 342 being positioned to ensure that the micro lens array will be in proper optical alignment with the corresponding VCSEL elements.

After the array of micro lens 342 has been fabricated on the glass window 340, the glass window 340 is inserted into the metal can 312 and sealed in place, beneficially using solder or an epoxy compound. The metal can 312 is then welded or otherwise bonded to the ceramic chip carrier 302, producing a sealed package.

Still referring to FIGS. 3 and 4, the individual elements of the VCSEL array 72 should be carefully aligned with the individual elements of the micro lens array 342. Furthermore, the dimensions of the metal can 312, of the glass window 340, of the micro lens 342, of the epoxy that retains the glass window 340 to the metal can 312, and the dimensions of the VCSEL array 72 must be carefully considered when designing the opto-electronic array device package 300. This will ensure the proper focal/collimation and other optical properties of the optical system.

Additionally, the electrical characteristics of the ceramic chip carrier 302, the conductive patterns 306, the VCSEL array 72, and the bonding wires 308 should be carefully controlled. In high-speed data communication applications the conductive patterns 306 should present accurately controlled input impedances. This will enable a reduction in electrical reflections on incoming data lines. Furthermore, the impedance of the conductive patterns 306 should carefully match the input impedances of the VCSEL array 72 and the length of the bonding wires 308 should be minimized. To assist controlling the input impedances of the conductive patterns 306 it may be beneficial to locate the conductive patterns 306 over a ground plane. Smooth, accurately located bends in the bonding wires 308 may be helpful.

Figure 5:
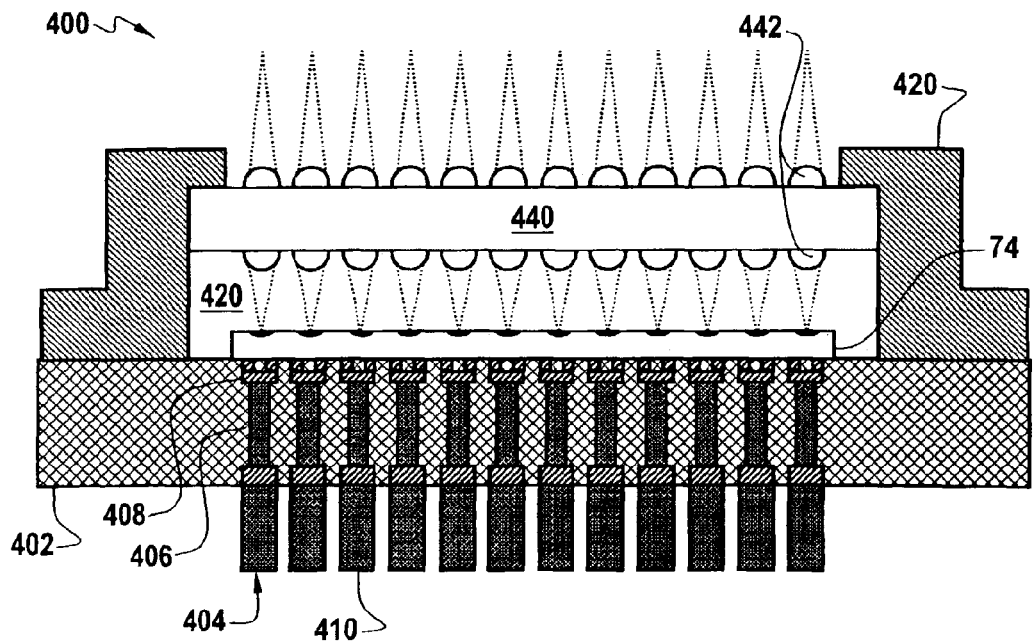
FIG. 5 illustrates a front cut-away view of a second embodiment opto-electronic packaging assembly that is in accord with the principles of the present invention.
Figure 6:
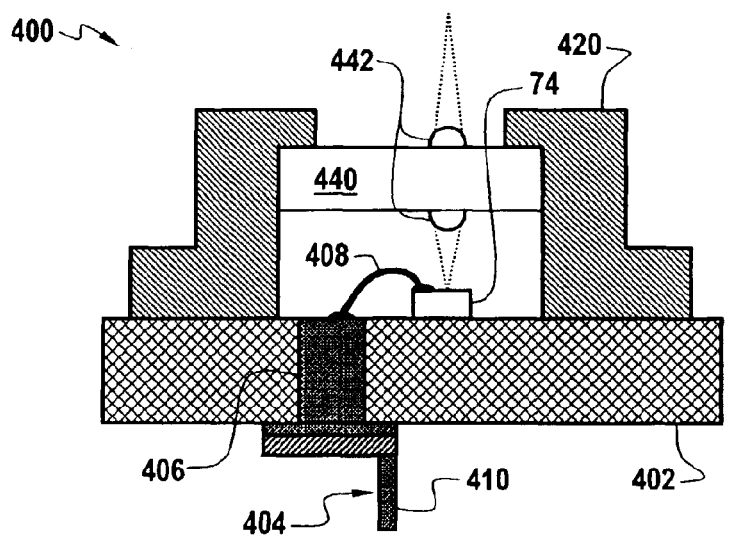
FIG. 6 illustrates a side cut-away view of the second embodiment opto-electronic packaging assembly.

FIGS. 5 and 6 illustrate a second embodiment opto-electronic device package 400 that is in accord with the principles of the present invention. As with the first embodiment (see FIGS. 3 and 4), the second embodiment can include, or can be part of, one or more of the variations that are subsequently described. The opto-electronic device package 400 is shown packaging a photo-detector array 74. However, it should be understood that the opto-electronic device package 400 could be used to package other types of opto-electronic devices, specifically including VCSEL arrays.

The photo-detector array 74 is attached to a ceramic chip carrier 402 having metal ground thermal plugs (not shown in FIGS. 5 and 6, but they are the same as the plugs 304 in FIGS. 3 and 4) and thru-via bottom contacts 404. The photo-detector array 74 is attached via a thermally conductive epoxy, solder, or similar bonding agent to the ceramic chip carrier 402. The metal ground thermal plugs conduct heat away from the photo-detector array 74. The use of a ceramic chip carrier 402 having metal ground thermal plugs is beneficial because of its high thermal conductivity, which minimizes thermal gradients. Here, the ceramic chip carrier 402 having metal ground thermal plugs is more beneficial, because the metal ground thermal plugs can be formed using the same process as the process of forming the thru-via. Furthermore, a ceramic chip carrier is also beneficial because of its structural stability, reasonable cost, and wide availability. An alternative chip carrier material is silicon. The thru-via bottom contacts 404 are comprised of a cylindrical shell 406 that extends through the ceramic chip carrier 402, a bonding wire 408 for making electrical contacts to the photo-detector array 74, and a flat, "L" shaped lower contact 410 that connects to the cylindrical shell 406 and that extends away from the ceramic chip carrier 402. The bonding wire 408 electrically connects contact pads to associated elements of the photo-detector array 74. The lower contacts 410 are used to electrically interconnect the photo-detector array 74 to external devices. It is desirable to have the lower contacts 410 and the contact pads plated with gold over nickel to assist electrical interconnections and reliability.

As shown in FIGS. 5 and 6, a metal can 420 is welded or soldered onto the ceramic chip carrier 402 to form a hermetic seal. The metal can 420 is located and dimensioned such that the contact pads are inside the area defined by the metal can 420, thus enabling electrical connections to the photo-detector array 74. The metal can 420 forms an internal well 420 that houses and protects the photo-detector array 74 and the bonding wires 408.

As shown, the metal can 420 retains a glass window 440 that supports an array of micro lens 442. While FIGS. 5 and 6 show an array of micro lens 442 that is comprised of micro-lenses 442 that are both on top of and below the glass window 440, in practice, and as subsequently shown in variations of the opto-electronic array device package 400, this is not required. Indeed, micro lens 442 can be only on the top of the glass window 440, below the glass window 440, or need not exist at all.

However, if used the array of micro lens 442 is beneficially comprised of and formed as previously discussed with reference to the array of micro lens 342. After the array of micro lens 442 has been fabricated on the glass window 440, the glass window 440 is inserted into the metal can 420 and sealed in place, beneficially using an epoxy compound. The metal can 420 is then welded to the ceramic chip carrier 402, producing a sealed package.

Still referring to FIGS. 5 and 6, the individual elements of the photo-detector array 74 should be carefully aligned with the individual micro lenses 442. Furthermore, the dimensions of the metal can 420, of the glass window 440, of the micro lenses 442, of the epoxy that retains the glass window 440 to the metal can 420, and the dimensions of the photo-detector array 74 must be carefully considered when designing the opto-electronic array device package 400. This will ensure the proper focal/collimation and other optical properties of the optical system.

Additionally, the electrical characteristics of the ceramic chip carrier 402, bottom contacts 404, photo-detector array 74, and bonding wires 412 should be carefully controlled. In high-speed data communication applications the conductive patterns bottom contacts 404 should present accurately controlled input impedances. This reduce electrical reflections on incoming data lines. Furthermore, the impedance of the bottom contacts 404 should carefully match the input impedances of the photo-detector array 74. The length of the bonding wires 408 should be minimized. To assist controlling the input impedances of the bottom contacts 404 is may be beneficial to locate the bonding wires 408 over a ground plane. Smooth, accurately located bends in the bonding wires 408 may be helpful.

While the foregoing has described two different opto-electronic device package embodiments that are in accord with the principles of the present invention, those embodiments are starting points for numerous variations. In general, the packages of an opto-electronic array mainly concern over the optical device itself and two interfaces between the optical device and the external medias that complete the application such as an optical high-speed communication system. The two interfaces are electrical and optical interfaces. Thus, variations on the packages of such an opto-electronic array focus on improving the characteristics of the two interfaces. The optical interface describes means controlling how optical output from optical devices such as VCSELs or PDs is coupled into (or from) external medias such as optical fibers, which includes air, glass windows, and optical lenses. The features of the optical interface that are in accord with the teachings of the present invention includes 1) a glass window in the optical path that forms a hermetic seal for the package, 2) optional use of micro-lens elements on either side of the glass window or on both sides of the glass window for optical beam collimation or focusing, and 3) an extended distance between the optical device and an external media (such as optical fibers) that further allows new packaging approaches. The electrical interface describes the path that electrical signals pass between optical devices and external electrical devices, which includes wire-bonds, impedance controlled lines, thru-via, flex circuits, and leads. The features of the electrical interface that are in accord with the teachings of the present invention includes 1) the use of a chip carrier or a substrate with impedance controlled traces for electrical inputs/outputs, 2) the use of thru-via in a ceramic substrate for electrical inputs/outputs, and the use of flexible circuits for the interface between the component substrate and other external electrical modules such as Printed Circuit Boards or ICs. Therefore, variations of the package that is in accord with the present invention are any combinations of the interface features described above. A sample of particularly useful variations will be described.

Figure 7:
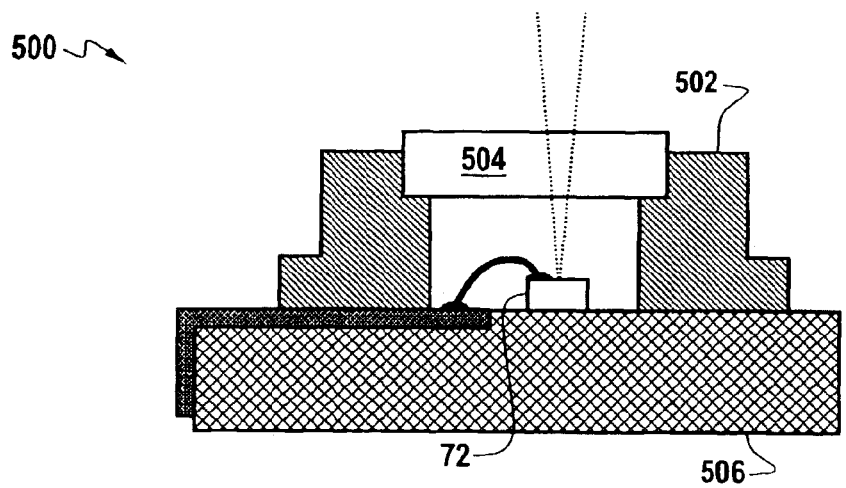
FIG. 7 illustrates a variation of the first and second opto-electronic packaging assemblies.

FIG. 7 illustrates a first variation opto-electronic device package 500. As shown, the first variation incorporates a different type of metal case 502. With the metal case 502, a glass window 504 can be added after the metal case 502 is attached to a ceramic base 506. This variation has the advantage that the metal case 502 can be attached first, the VCSEL array 72 can be tested, and then the glass window 504 can be added. FIG. 7 illustrates a case where micro-lens arrays are not used. However, this variation and other variations described in this invention are applicable to cases where micro-lens are used either on top or bottom of the glass window 504, or both sides of the glass window 504.

Figure 8:
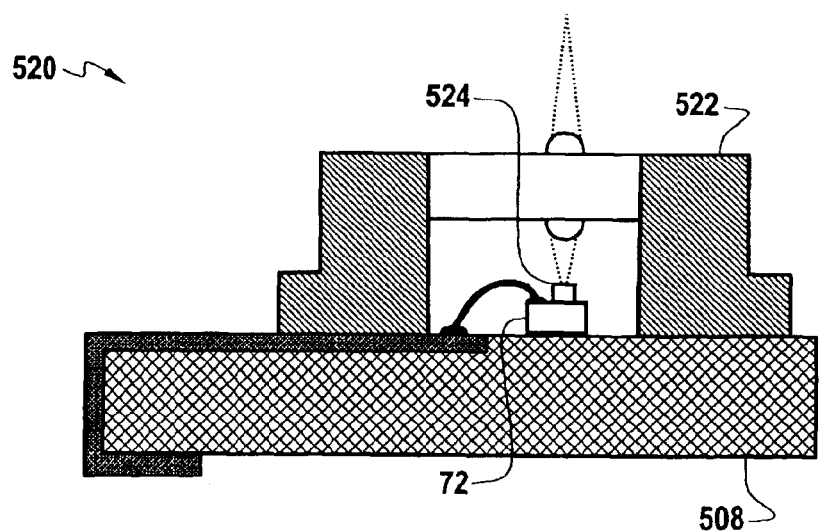
FIG. 8 illustrates another variation of the first and second opto-electronic packaging assemblies.

FIG. 8 illustrates a second variation opto-electronic device package 520. As shown, the second variation incorporates yet another type of metal case 522. However, more importantly, FIG. 8 illustrates the use of wafer-level integrated lenses 524. Such wafer-level integrated lenses 524 are formed on or added to a VCSEL array 72. The wafer-level integrated lenses 524 can be used for focusing or collimating.

Figure 9:
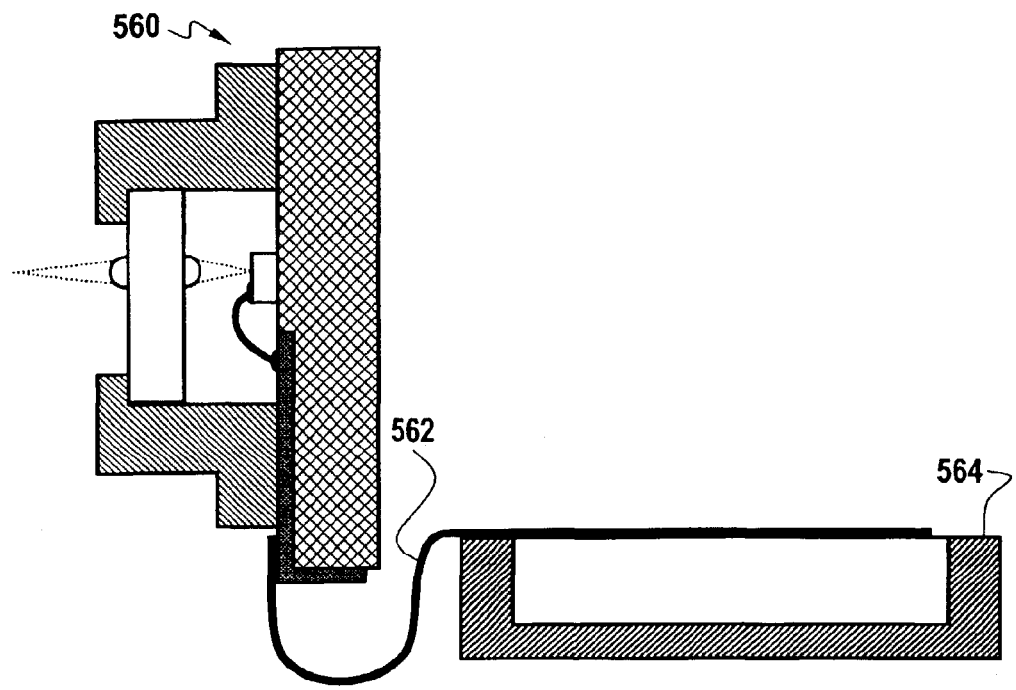
FIG. 9 illustrates a first method of electrically connecting the first and second opto-electronic packaging assemblies to external devices.

FIG. 9 illustrates another variation opto-electronic array device package 560. As shown, that variation includes a flex cable 562 for connecting to an external structure 564. The external structure can be a board or a device, such as a chip, or a connector. The flex cable 562 can connect via wire-wrap, weld, solder, solder balls, pin connectors or similar attachment. Furthermore, while FIG. 9 shows the flex cable 562 coming from the topside, if the second embodiment opto-electronic device package is used, the flex cable could extend from the bottom.

Figure 10:
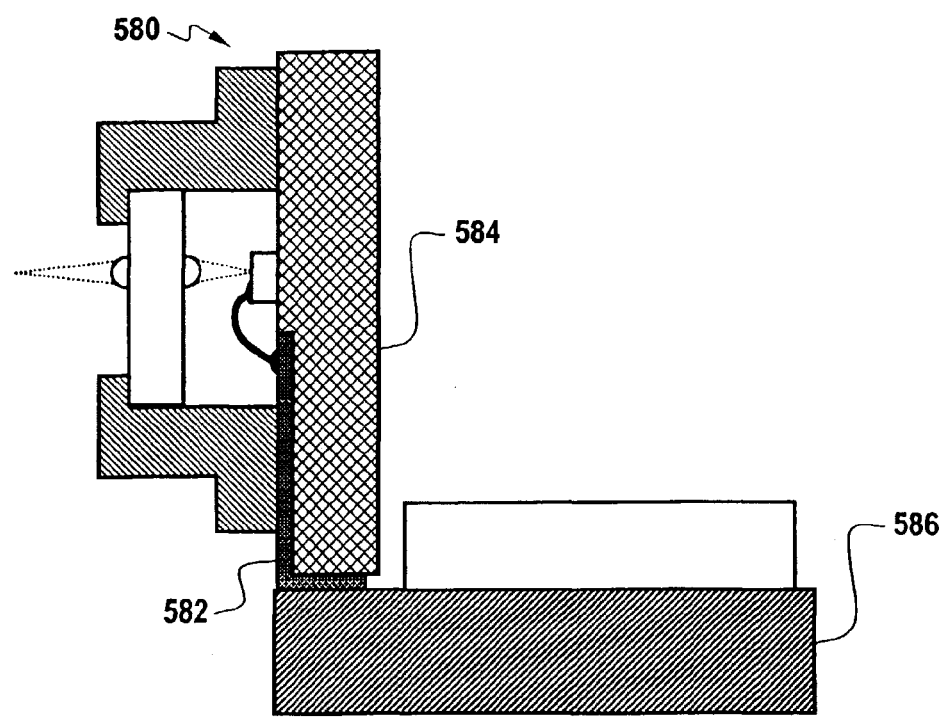
FIG. 10 illustrates another method of electrically connecting the first and second electronic packaging assemblies to external devices.

FIG. 10 illustrates another variation opto-electronic device package 580. As shown, that variation is surface mounted via conductors 582 on a substrate 584 to an external structure 586. Again, the external structure can be a board or a device, such as a chip, or a connector.

Figure 11:
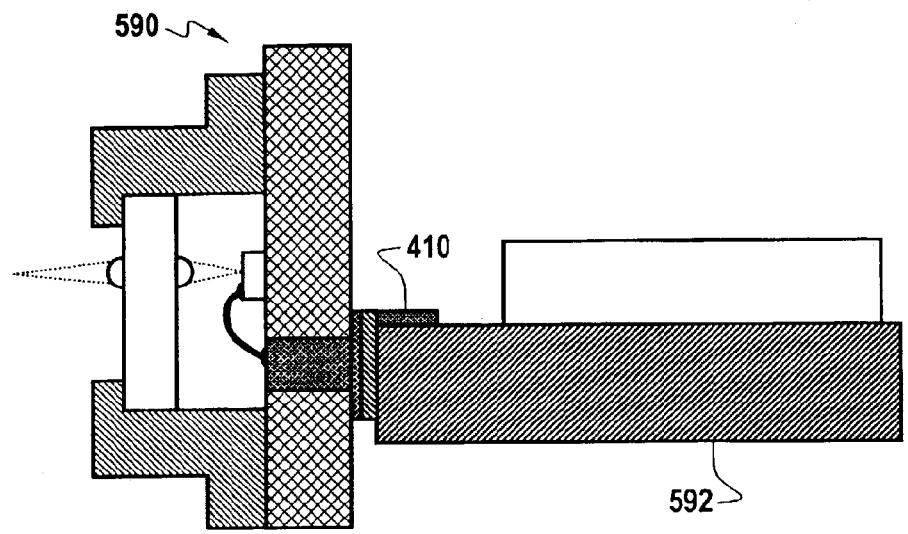
FIG. 11 illustrates yet another method of electrically connecting the first and second opto-electronic packaging assemblies to external devices.

FIG. 11 illustrates still another variation opto-electronic array device package 590. As shown, that variation is soldered to an external structure 592 via lower contacts 410.

Figure 12:
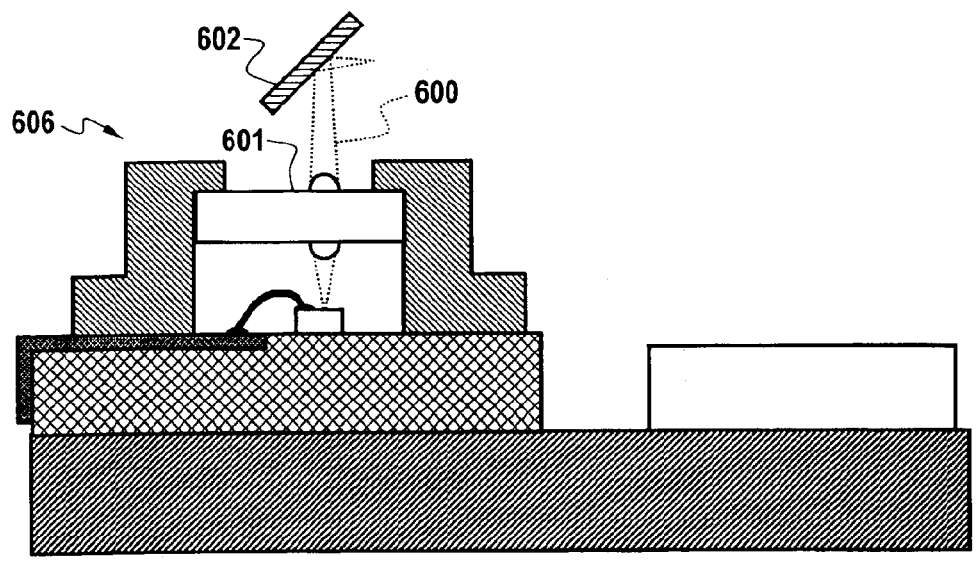
FIG. 12 illustrates a method of optically coupling the first and second opto-electronic packaging assemblies to the external environment.

As previously discussed, the principles of the present invention are directed to opto-electronic device packages. As such, they include a transparent (glass) window that enables light to pass into or out of the opto-electronic device package. FIG. 12 illustrates a way of doing this. Basically, light 600 passes through a glass window 601 as the light 600 is emitted from or directed to the opto-electronic package 606. If required, that light can be reflected or otherwise processed by external elements 602.

Figure 13:
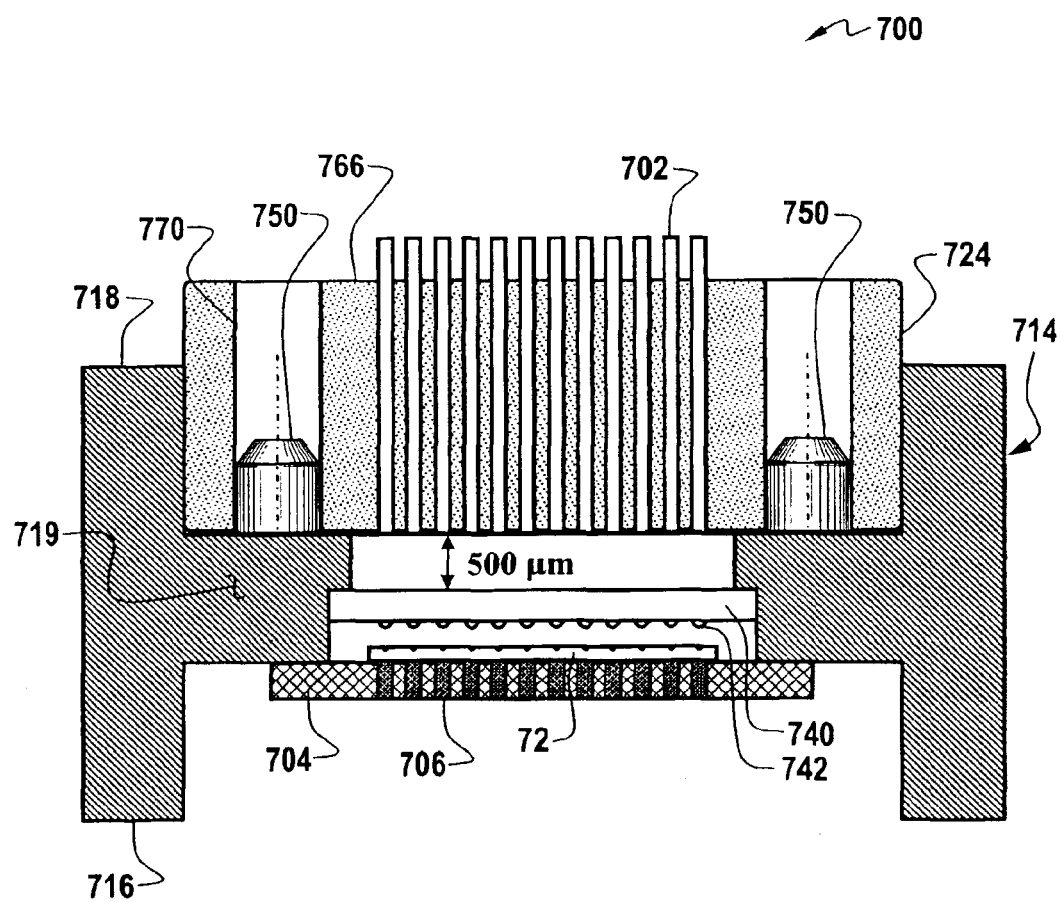
FIG. 13 illustrates another method of optically coupling the first and second opto-electronic packaging assemblies with an optical fiber array.

While direct optical paths as shown in FIG. 12 are anticipated, the principles of the present invention are particularly beneficial to applications that use parallel ribbon optical fibers. FIG. 13 illustrates an opto-electronic array device package 700 that includes parallel ribbon optical fibers 702. As shown, that package houses a VCSEL array 72 that is attached to a ceramic chip carrier 704 having metal ground thermal plugs 706. While not shown, it should be understood that electrical contacts for the VCSEL array 72 are included. Such contacts can be either bottom contacts or top/side contacts (see FIGS. 3–6).

Still referring to FIG. 13, the opto-electronic array device package includes a metal can 714 that is welded to the ceramic chip carrier 704 to form a hermetic seal. The metal can 714 includes bottom legs 716 for encompassing a heatsink (not shown), top legs 718 for receiving a multi-element ribbon-type optical fiber connector 724 (discussed in more detail subsequently), and a central body 719. The central body 719 is actually welded to the VCSEL array die 72. The central body 719 also retains a glass window 740 that supports a micro lens array 742, and guide pins 750 for guiding the multi-element ribbon-type optical fiber connector 724 into position.

Still referring to FIG. 13, the multi-element ribbon-type optical fiber connector 724 includes a plurality of evenly spaced optical fibers 702. Those optical fibers are retained by and encased in a flexible housing 766. The flexible housing 766 includes guide apertures 770 for receiving the guide pins 750 when the multi-element ribbon-type optical fiber connector 724 is connected to the opto-electronic array device package 700. Furthermore, the multi-element ribbon-type optical fiber connector 724 and the top legs 718 of the metal can 714 are dimensioned to mate.

Still referring to FIG. 13, the spacing of the optical fibers 702, the individual elements of the micro-lens array 742, and the individual elements of the VCSEL array 72 should be carefully dimensioned to properly align. Furthermore, the dimensions of the metal can 714 should be such that proper focusing of the optical elements is achieved. This will ensure the proper focal/collimation and other optical properties of the optical system.

The embodiments and examples set forth herein are presented to explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. An opto-electronic housing, comprising:
 a substantially planar submount having a plurality of conductive traces on a planar surface thereof;
 a metallic can attached to the planar surface of said submount forming a cavity having the planar surface of said submount on a first surface thereof and said can on at least a second surface thereof, said cavity having an opening for light to pass through; and
 a transparent window in or covering said opening and attached to said can;
 wherein said plurality of conductive traces extend along the planar surface of the submount from inside the cavity to beyond the can; and
 wherein said cavity is hermetically sealed and comprises said window on a first surface, said submount on an opposing second surface, and said can on the surfaces interconnecting said window and said submount.

2. The opto-electronic housing according to claim 1, wherein said submount includes ceramic.

3. The opto-electronic housing according to claim 1, further including a micro lens array on the transparent window, wherein said micro lens array includes individual lens elements.

4. The opto-electronic housing according to claim 1, further including an opto-electronic array in said cavity, wherein said opto-electronic array is electrically connected to said conductive traces.

5. The opto-electronic housing according to claim 4, wherein said opto-electronic array includes a vertical cavity surface emitting laser (VCSEL).

6. The opto-electronic housing according to claim 4, wherein said opto-electronic array includes a photo detector.

7. The opto-electronic housing according to claim 4, wherein said opto-electronic array includes integrated lenses.

8. The opto-electronic housing according to claim 1, wherein a plurality of heat conductive plugs pass through said submount.

9. An opto-electronic device, comprising:
 a substantially planar submount comprising substantially planar surface;
 a plurality of thru-via conductive contacts passing through said planar surface;
 a plurality of opto-electronic devices mounted directly or indirectly on said submount, wherein each of said plurality of opto-electronic devices is in communication with at least one of said conductive contacts;

a metallic can attached to the planar surface of said submount and forming a cavity, wherein said can includes an opening for light to pass through, and wherein said cavity extends over said opto-electronic devices and said conductive contacts; and a transparent window in or covering said opening and attached to said can;

wherein said cavity is hermetically sealed and comprises said window on a first surface, said submount on an opposing surface, and said can on the surfaces interconnecting said window and said submount.

10. The opto-electronic housing according to claim 9, wherein said submount includes ceramic.

11. The opto-electronic housing according to claim 9, further including a micro lens array on the transparent window, wherein said micro lens array includes individual lens elements.

12. The opto-electronic housing according to claim 9, further including an opto-electronic array in said cavity that is electrically connected to said conductive contacts.

13. The opto-electronic housing according to claim 12, wherein said opto-electronic array includes a vertical cavity surface emitting laser (VCSEL).

14. The opto-electronic housing according to claim 12, wherein said opto-electronic array includes a photo detector.

15. The opto-electronic housing according to claim 12, wherein the opto-electronic array includes integrated lenses.

16. An opto-electronic housing, comprising:

a substantially planar submount holding an opto-electronic array having a plurality of opto-electronic devices;

a metallic support comprising a central body, parallel legs, and guide pins, wherein said support is attached to said substantially planar submount and forms a cavity with an opening for light to pass through; and a transparent window in or covering said opening and attached to said support, wherein a hermetic seal is formed, and wherein a cavity is formed, said cavity comprising said window on a first surface, said submount on an opposing surface, and said support on the surfaces interconnecting said window and said submount;

wherein a flexible ribbon-type optical cable having a plurality of optical fibers and openings that align with the guide pins can be mounted between said parallel legs, said guide pins fitting into said openings when the flexible ribbon-type optical cable is attached to said support.

17. The opto-electronic housing according to claim 16, wherein said opto-electronic array includes discrete optical elements, and wherein the optical elements optically align with said plurality of optical fibers when said flexible optical cable is attached to said support.

18. The opto-electronic housing according to claim 16, wherein the support is monolithic.

19. The opto-electronic housing according to claim 1, wherein said second surface further comprises a plurality of opto-electronic devices.

20. The opto-electronic housing according to claim 1, wherein said transparent window is bounded laterally by said metallic can.

21. The opto-electronic housing according to claim 9, wherein said transparent window is bounded laterally by said metallic can.

22. The opto-electronic housing according to claim 16, wherein said support is welded to said substantially planar submount.

* * * * *